United States Patent
Aggarwal (10) Patent No.: US 10,096,969 B1
(45) Date of Patent: Oct. 9, 2018

(54) METHOD FOR DITHER FREE ADAPTIVE AND ROBUST DOSE CONTROL FOR PHOTOLITHOGRAPHY

(71) Applicant: Cymer, LLC, San Diego, CA (US)

(72) Inventor: Tanuj Aggarwal, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/705,221

(22) Filed: Sep. 14, 2017

(51) Int. Cl.
   *H01S 3/13* (2006.01)
   *H01S 3/11* (2006.01)
   *H01S 3/225* (2006.01)
   *G03F 7/20* (2006.01)

(52) U.S. Cl.
   CPC ........ *H01S 3/1305* (2013.01); *G03F 7/70025* (2013.01); *H01S 3/11* (2013.01); *H01S 3/225* (2013.01)

(58) Field of Classification Search
   CPC .......... H01S 3/1305; H01S 3/225; H01S 3/11; G03F 7/70025
   See application file for complete search history.

(56) References Cited

U.S. PATENT DOCUMENTS

| | | | | |
|---|---|---|---|---|
| 6,067,306 A * | 5/2000 | Sandstrom | .......... | G03F 7/70025 372/38.01 |
| 9,832,852 B1 * | 11/2017 | Fomenkov | ............ | H05G 2/006 |
| 2008/0144671 A1 * | 6/2008 | Ershov | ................ | G03F 7/70583 372/5 |
| 2008/0165337 A1 * | 7/2008 | Ershov | ................ | G03F 7/70025 355/67 |
| 2008/0225908 A1 * | 9/2008 | Ershov | ................ | G03F 7/70025 372/25 |
| 2008/0267242 A1 * | 10/2008 | Ershov | ................ | G03F 7/70025 372/57 |
| 2009/0122825 A1 * | 5/2009 | Ershov | ................ | G03F 7/70583 372/57 |
| 2010/0098122 A1 * | 4/2010 | Jacques | ............... | G03F 7/70025 372/38.01 |
| 2010/0098123 A1 * | 4/2010 | Jacques | ............... | G03F 7/70025 372/38.07 |
| 2010/0098124 A1 * | 4/2010 | Jacques | ................... | H01S 3/104 372/38.07 |
| 2014/0191133 A1 * | 7/2014 | Crouch | ................... | H05G 2/003 250/372 |

* cited by examiner

*Primary Examiner* — Yuanda Zhang
(74) *Attorney, Agent, or Firm* — Arent Fox LLP (57) ABSTRACT

A method and apparatus for controlling a dose of radiation generated by a laser light source is disclosed. In one embodiment, a dose controller receives measurements of the deviation of output energy from an expected output energy, or "energy sigma," and the standard deviation of the error in the dose received by the item being processed from the desired dose. The ratio of the energy sigma to the standard deviation of dose error is calculated, and the laser controller adjusts the controller gain based upon the calculated ratio so as to adjust the voltage determined by the controller, and consequently the output energy and thus the dose to the item. This is an improvement over the prior art, in which the controller gain is adjusted based upon sending a voltage dither to the laser and correlating it to its response in energy at only one frequency.

9 Claims, 10 Drawing Sheets

METHOD FOR DITHER FREE ADAPTIVE AND ROBUST DOSE CONTROL FOR PHOTOLITHOGRAPHY

FIELD OF THE INVENTION

The present invention relates generally to deep ultraviolet (DUV) light sources. More specifically, the invention relates to a method and apparatus for improving the control of a dose of DUV radiation generated by a DUV light source to be applied to an item, such as a semiconductor wafer, that is being processed.

BACKGROUND OF THE INVENTION

The semiconductor industry continues to develop lithographic technologies that are able to print ever-smaller integrated circuit dimensions. Modern photolithography typically uses a laser light source, also known as a laser system, to provide very narrow band light pulses that illuminate a mask in order to expose photo-resistive material on silicon wafers, also known as substrates.

Some of the most common systems currently used in photolithography are deep ultraviolet ("DUV") light systems. DUV light is generally defined to be electromagnetic radiation having wavelengths of between about 5 and 250 nanometers (nm) and is produced by certain types of excimer lasers (argon-fluorine or "ArF," and krypton-fluorine or "KrF"). To accurately mass produce semiconductors, these systems must be highly reliable and provide cost effective throughput and reasonable process latitude.

The substrates are typically held in devices known stepper-scanners, or simply scanners. Advances in semiconductor device technology continue to place increasing demands on the performance characteristics of both the laser light sources and scanners, requiring continuing improvements in the precision and speed of operation of these devices.

As is known in the art, a sensor in the scanner may periodically communicate the laser light parameters desired to achieve a desired dosage of laser light energy for use in the photolithographic process to the laser light source. In turn, the laser light source can then generate the appropriate laser light and output it to the scanner.

It will be apparent to one of skill in the art that it is not only desirable but very important to be able to control the amount, or "dose," of DUV light energy being applied to a particular item being treated, such as a semiconductor wafer. The dose is generally defined as the weighted sum of energy delivered to the substrate over a number of consecutive pulses of light generated by the laser. For example, typically a specified amount of DUV light energy, sometimes referred to as a "target dose," will be required to accomplish a given task, such as curing a layer of photoresist, on a semiconductor wafer as part of the manufacturing process. In order to obtain consistent results across different wafers, it will be desirable to apply the same amount of DUV light energy to each wafer, to as great a degree of accuracy as possible.

There are a number of issues that may arise in providing accurate dose control. The lasers used typically must fire some number of laser pulses to reach stable operation, and thus it can take time for the generated laser light to reach a stable operating point after the desired parameters have been received from the scanner. Noise and other disturbances in the laser source can make it difficult to accurately generate the laser light at the desired energy level. There is also often a tradeoff between stability and performance.

What is needed is an improved way to quickly and accurately control a dose of DUV radiation generated by a light source that is robust against unknown variations in the system gain.

SUMMARY OF THE INVENTION

Described herein is a method and apparatus for improving the control of a dose of radiation generated by a laser light source and applied to an item, such as a semiconductor wafer, being processed.

In one embodiment, a method of laser light dose control is disclosed, comprising: receiving, by a dose controller, an energy target and a first laser voltage; causing, by the dose controller, a laser source to fire a plurality of laser pulses starting at the first laser voltage; measuring, by a sensor, output energy generated by the laser source for each of the plurality of pulses; for a number of laser pulses, after one or more pulses, adjusting, by the dose controller, the first laser voltage based upon the controller gain and the difference between the energy target and the measured output energy; receiving, by the dose controller, a measurement of dose energy received at a scanner from the plurality of pulses; once the number of laser pulses has been fired, determining, by the dose controller, an energy sigma representing variation in average output energy over the number of pulses; determining, by the dose controller, a dose sigma representing variation between the dose energy received at the scanner and the dose target; calculating, by the dose controller, a ratio of the energy sigma to the dose sigma; updating, by the dose controller, the controller gain in response to a change in the ratio; updating, by the dose controller, the voltage based upon the controller gain and the difference between the energy target and the measured output energy; and causing, by the dose controller, the laser source to fire additional laser pulses using the updated laser voltage.

Another embodiment discloses a laser system for laser light dose control, comprising: a sensor for measuring output energy generated by a laser source for each of a plurality of pulses; and a dose controller configured to: receive an energy target and a laser voltage; cause the laser source to fire a plurality of pulses using the first laser voltage; for a number of laser pulses, after one or more pulses, adjust the first laser voltage based upon the difference between the energy target and the measured output energy; receive from a scanner, for the plurality of pulses, a measurement of dose energy received at the scanner; once the number of laser pulses has been fired, determine an energy sigma representing variation in average output energy over the number of pulses; determine a dose sigma representing variation between the dose energy received at the scanner and the dose target; calculate a ratio of the energy sigma to the dose sigma; update the controller gain in response a change in the ratio; update the laser voltage in response to a change in the controller gain; and cause the laser source to fire additional laser pulses using the updated laser voltage.

Still another embodiment discloses a non-transitory computer readable storage medium having embodied thereon instructions for causing a computing device to execute a method of laser light dose control, the method comprising: receiving, by a dose controller, an energy target and a first laser voltage; causing, by the dose controller, a laser source to fire a plurality of laser pulses starting at the first laser voltage; measuring, by a sensor, output energy generated by the laser source for each of the plurality of pulses; for a number of laser pulses, after one or more pulses, adjusting, by the dose controller, the first laser voltage based upon the controller gain and the difference between the energy target and the measured output energy; receiving, by the dose controller, a measurement of dose energy received at a scanner from the plurality of pulses; once the number of laser pulses has been fired, determining, by the dose controller, an energy sigma representing variation in average output energy over the number of pulses; determining, by the dose controller, a dose sigma representing variation between the dose energy received at the scanner and the dose target; calculating, by the dose controller, a ratio of the energy sigma to the dose sigma; updating, by the dose controller, the controller gain in response to a change in the ratio; updating, by the dose controller, the voltage based upon the controller gain and the difference between the energy target and the measured output energy; and causing, by the dose controller, the laser source to fire additional laser pulses using the updated laser voltage.

DETAILED DESCRIPTION OF THE INVENTION

The present application describes a method and apparatus for improving the control of a dose of radiation generated by a laser light source, for example, a DUV light source, and applied to an item being processed, such as a semiconductor wafer.

In one embodiment, a dose controller receives measurements of the output energy of a laser source and of the dose resulting from that energy at a scanner containing the item to be processed. From these measurements, the dose controller initially provides a control signal that updates the laser voltage after each pulse, by using a conventional feedback architecture and internal "controller gain." After a number of pulses, the dose controller uses the measurements obtained from the pulses to determine the deviation of output energy from its mean output energy, or "energy sigma," and the deviation of the error in the dose, or "dose sigma," received by the item being processed from the desired target dose. The ratio of the energy sigma to the dose sigma is calculated, and the dose controller adjusts the gain of the controller such that the calculated ratio is regulated to a constant pre-determined value. This is contrary to the prior art, in which the controller gain is adjusted based on an estimate of the laser gain obtained by sending a voltage dither at a certain frequency and correlating it to its response in output energy; the adjusted controller gain is then multiplied to the error between output energy and a desired energy target which is then used by the dose controller to compute the voltage applied to the laser source.

In order to achieve accurate dose control, it is desirable for the laser to produce pulses of light, such that the weighted sum of the energy received by the item being processed is as close to the dose target as possible. This is typically achieved by feedback control, in which the output energy is monitored and used to modify the input voltage such that the pulse energy closely matches the target output and the dose closely matches the dose target.

Optimal performance generally requires accurate knowledge of a laser's efficiency or gain, i.e., the amount of energy produced per unit of input voltage. This gain is usually measured in units of millijoules per volt (mJ/V). Most commonly, the inverse of the gain may be fed to a controller. This allows for design of controllers without any prior knowledge of a specific system's gain.

Figure 1:
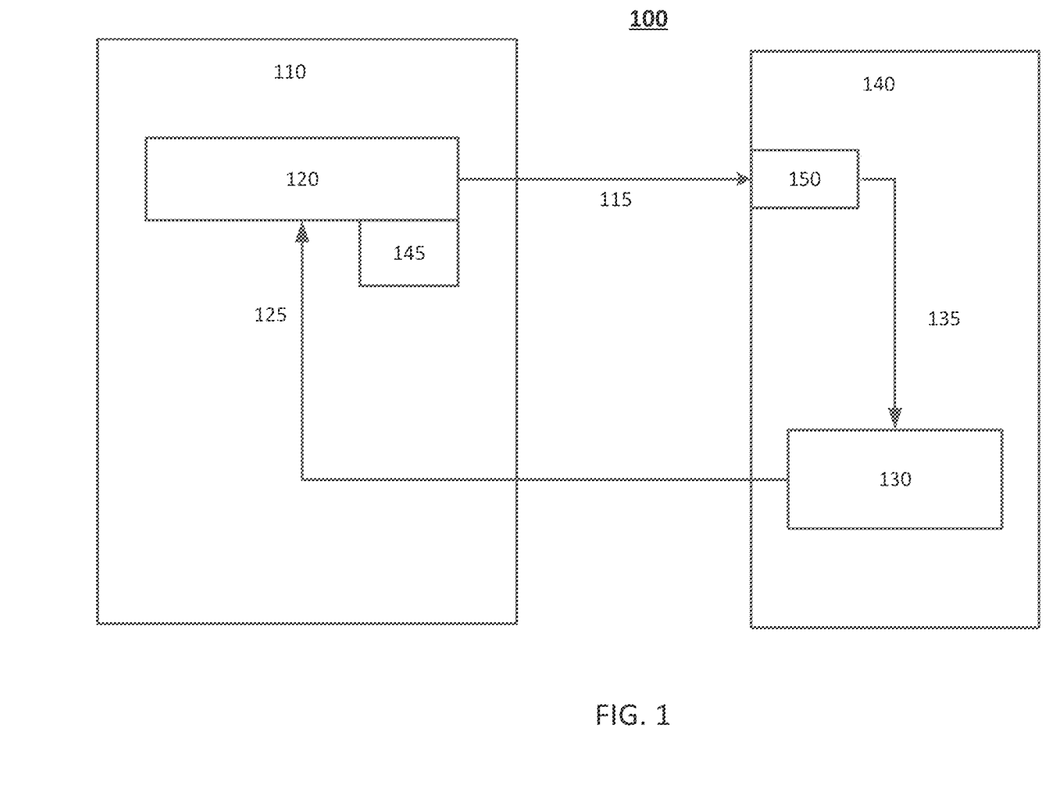
FIG. 1 is a block diagram of some of the components of a typical laser system that may be used in some embodiments.

FIG. 1 is a block diagram of a system 100 that includes a laser system 110 and scanner 140 that may be used in a modern DUV photolithography process and with the present approach. A laser source 120 in laser system 110, which provides laser light, can be a single or dual chamber system, controlled by a dose controller 130 through a communication link 125. When laser source 120 fires the resulting laser light 115 is provided to scanner 140, where it exposes a wafer situated therein. While dose controller 130 is illustrated as being located in scanner 140 as is done in some embodiments, in other embodiments it may be located in laser system 110.

The laser light 115 is typically passed through a barrier having a slit that creates a "window" on the wafer. When a standard rectangular slit is used, all of the laser pulses of a given energy in laser light 115 will provide the same intensity irradiation to the wafer. In some cases, a different shape of slit may be used, which will alter the intensity with which laser light 115 exposes the wafer. For example, scanners from ASML Holding N.V. use a particular slit that results in the laser light striking the wafer not being uniform, but rather in pulses being less intense at the edges of the window, and more intense in the center of the window. Movement of the wafer in the scanner is controlled so as to allow for such non-uniform intensity in the window and achieve a desired exposure across the entire wafer.

In some embodiments, system 100 may include one or more sensors. For example, as illustrated in FIG. 1 a first sensor 145 may measure the output energy of laser source 120, while a second sensor 150 may measure the dose energy received at scanner 150. In some embodiments, there may be only a single sensor located at the scanner that measures the pulse energy, with the dose then computed by applying a slit function to the measured pulse energy. One of skill in the art will be able to determine how many sensors are appropriate for a given application, and where such sensors should be located.

Scanner 140 can communicate desired parameters for the laser light to be generated to laser system 110 via another communication link 135. The desired parameters are those that are expected to achieve a desired exposure in the photolithography process, and typically include such things as laser light wavelength, energy level and a timing trigger for when the laser system is to fire the laser. The laser system then generates the laser light 115 based on those parameters. This process continues, in some cases as often as with each laser pulse, as scanner 140 communicates additional desired parameters for further laser light pulses to be generated by laser system 110.

In some systems, laser energy is controlled by a simple integrator controller, which simply sums the error between the energy output by the laser and a target energy. This is known as a laser energy controller, or LEC. In other systems, laser energy is controlled by the scanner's dose controller in a feedback loop. This is known as a scanner energy controller, or SEC.

As is known in the art, there is a relationship between the amount of voltage applied to laser source 120, as specified by dose controller 130 via communication 125, and the resulting energy in the generated laser light. In general, the greater the applied voltage the greater the resulting energy. This gain relationship is commonly represented by a "gain equivalent" in which the actual gain is represented by the ratio of the change in voltage required for a change in output energy, or dv/de, which is the derivative of voltage with respect to energy. U.S. Pat. No. 7,756,171 and U.S. patent application Ser. No. 11/900,527, each incorporated by reference herein, describe these aspects known in the art.

It will be appreciated that the ratio dv/de is volts/energy inverted with respect to the gain expressed in mJ/V, which is energy/voltage. Thus, when the change in output energy is too high or too low compared to what the controller demands and adjustment to the gain of the system is needed, the controller will adjust the controller gain down or up, respectively, as necessary to match the changes in output energy to the controller demands. It is sometimes said that the controller may be thought to be introducing a gain that is inverted compared to the gain of the system, so as to normalize the overall gain, i.e., the product of system gain and the controller gain, back to a desired value, typically chosen to be equal to 1.

However, this simple description belies a number of issues that arise in the process. In the first instance, a given voltage will not always result in the same energy. Thus, rather than assuming such a relationship, it is known in the art to use what is called a gain estimator, a circuit that uses an algorithm to estimate the dv/de relationship. The output of the gain estimator is fed to the dose controller 130 and used to compute the final voltage value that the laser system then uses to generate the laser light at the desired energy level. U.S. Pat. No. 8,102,889, incorporated by reference herein, describes these aspects known in the art.

The gain estimator algorithm is commonly created by varying the voltage locally at a certain frequency (known as dithering), thus creating a value for dv, and then using the corresponding measured response in energy (i.e., the de) to compute de/dv, the inverse of the gain, as an output. Correlation or Fourier analysis is then used to estimate the gain of the system. This inverse of the gain is the output of the gain estimator.

A larger amplitude of the dither is beneficial for determining dv/de. However, the accuracy of the dose will suffer if the dither is too large, so the dither is kept very small in order to minimize the effect on dose performance. The dither is sinusoidal in shape so that the average value is zero. However, the dose may still be degraded to some extent depending upon the frequency and amplitude of the dither.

Further, the gain of the laser system may be affected by noise and other disturbances, can vary with the frequency at which the voltage is dithered and harmonics thereof (known as "frequency dependent gain" or FDG), and can change quickly for various other reasons, requiring the controller to update its own gain quickly as well.

In the prior art, to address the issue of noise, the output of the gain estimator is strongly low-pass filtered to counter the effects of any such noise. This can reduce the speed of estimation of the gain, and thus it may take as many as 10,000 laser pulses to determine the gain. If there are subsequent large variations in the system, it may take additional thousands of pulses to stabilize the system again.

Traditional adaptive controller techniques are sensitive to the FDG of the laser source, which can significantly affect the stability margins and dose performance of the system. An adaptive controller using the output of the gain estimator may react more strongly in the presence of even small levels of FDG and result in a sub-optimal dose (either too high or too low), and even cause instability of the system under extreme conditions.

As with compensation for noise as discussed above, a change in the system gain for any other reason, which can happen quickly, may similarly take thousands of pulses to correct. System performance can suffer until there are enough pulses for the controller to converge on a solution to the correction needed to obtain the desired gain from the system.

The present disclosure describes a method and apparatus in which these issues can be at least mitigated by using a different gain equivalent than dv/de. In one embodiment, once a sufficient number of pulses has occurred to allow for determination of the appropriate values, the different gain equivalent is selected such that the ratio of the "energy sigma," or variation in the output energy, to the standard deviation of the error in the dose from a target dose, or "dose sigma" is regulated to a desired target. This ratio is referred to herein as the "energy sigma/dose sigma" ratio.

Energy sigma refers to the standard deviation in the average output energy as compared to the target energy over a predetermined number of pulses. The number of pulses is set so that reliable measures for computing the standard deviation can be obtained; it may generally be wise to keep the number of pulses the same as the number of pulses over which dose is computed using weighted averaging. In some embodiments, the number may be as few as 41 pulses but may vary. The number of pulses may depend on the physical dimensions of the slit and the stage scan speed. A fast stage speed will result in sampling fewer points of the slit, thus reducing the number of pulses or window and vice-versa.

The dose error used is the weighted moving average of the energy received at the scanner as compared to the target dose. Those of skill in the art will appreciate that the received dose may be weighted in some cases, to account for differences in the slit described above that helps to determine how the laser light is received at scanner 140 in FIG. 1. This is accomplished by filtering the received energy by a slit function appropriate for the slit used.

In the case of a rectangular slit, the slit function is simply the uniform weighting function such that all pulses are weighted equally. In the case of the slit described above in a scanner from ASML Holding N.V. (hereafter "the ASML slit"), the received dose will be weighted to count pulses at the center of the window more than those at the edge of the ASML slit that accounts for the fact that the slit creates a window in which a pulse has more intensity in the center than at the edges of the window, as described above.

Using the energy sigma/dose sigma ratio exploits an inherent tradeoff between the standard deviation of dose error and the variation in energy and has a number of advantages over the traditional measure of dv/de. The energy sigma/dose sigma ratio requires no dither, but rather is very easy to calculate from raw data, and responds to changes in system gain much more rapidly than the traditional approach using dv/de. The energy sigma/dose sigma ratio may be calculated with a far fewer number of pulses, often less than 100, rather than the thousands of pulses needed by a traditional gain estimator. Thus, faster regulation or adaptation of controller gain may be achieved. Further, the few parameters that are needed to adjust the gain of the controller are largely independent of typical noise characteristics of the system.

The energy sigma/dose sigma ratio has a monotonic relationship to the difference in gain between the controller and the system, i.e., there is only a single value of energy sigma for each value of the dose sigma so there is no confusion as to how to adjust the gain of the system. By regulating the energy sigma/dose sigma ratio, the gain difference can be well controlled so as to provide robust stability. This also helps maintain the total dose at or near the desired level, even in the presence of large fluctuations due to FDG.

The following Figures will help to illustrate the benefits of using the energy sigma/dose sigma ratio rather than the traditional dv/de. FIGS. 2 through 6 show the relationship between energy sigma and dose sigma as a function of the controller gain for various combinations of slit type and controller type. One of skill in the art will appreciate that the results shown herein are from a steady-state condition, but as above for real-time applications the weighted moving standard deviation of dose and moving standard deviation of energy error are computed over a fixed number pulses corresponding to the width of the window.

Figure 2:
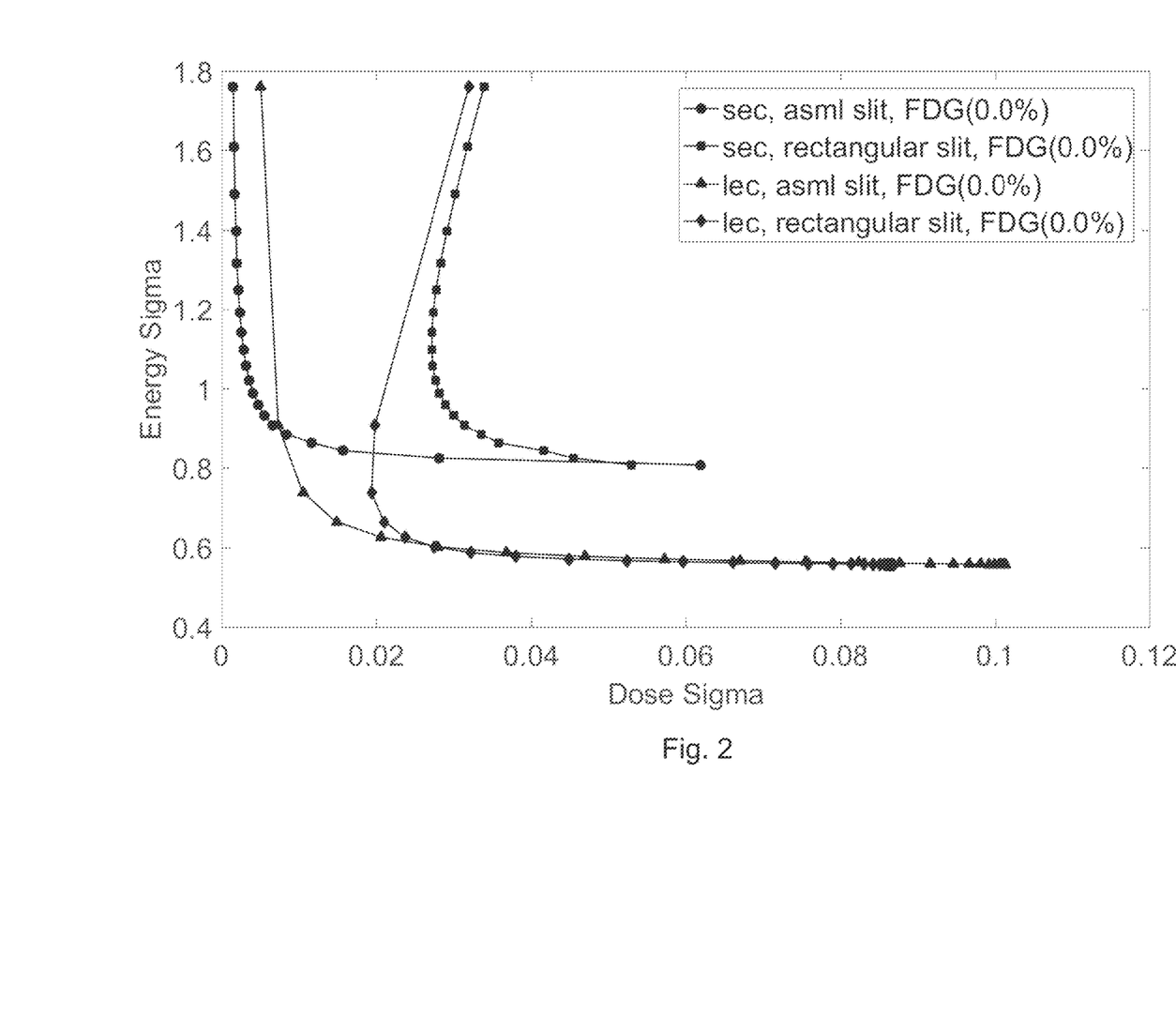
FIG. 2 illustrates graphs of the relationship between energy sigma and dose sigma in various embodiments.

FIG. 2 illustrates graphs of the relationship between energy sigma and dose sigma in four different cases: a scanner energy controller (SEC) with an ASML slit, an SEC with a rectangular slit, a laser energy controller (LEC) with an ASML slit, and an LEC with a rectangular slit.

It may be seen from FIG. 2 that different controllers in combination with different slits result in different relationships between dose sigma and energy sigma. It may also be seen that when the ASML slit is used, the relationship between energy sigma and dose sigma is monotonic for both types of controller, i.e., there is only one value of energy sigma for any given value of dose sigma, and over a large range of gains. However, this is not true with the rectangular slit, as for both types of controller there are some values of dose sigma that can result in two values of energy sigma. The LEC controller and rectangular slit combination loses monotonicity for gains close to the instability margin, although this is not apparent from FIG. 2.

It will also be seen that for either controller with the ASML slit, as dose sigma gets smaller, energy sigma gets larger. One of skill in the art will appreciate that this will create problems in using energy sigma/dose sigma ratio to control gain, and so it is desirable to operate in range in which a small enough mean dose results in a small enough energy sigma so that the ratio allows the controller to operate.

Figure 3:
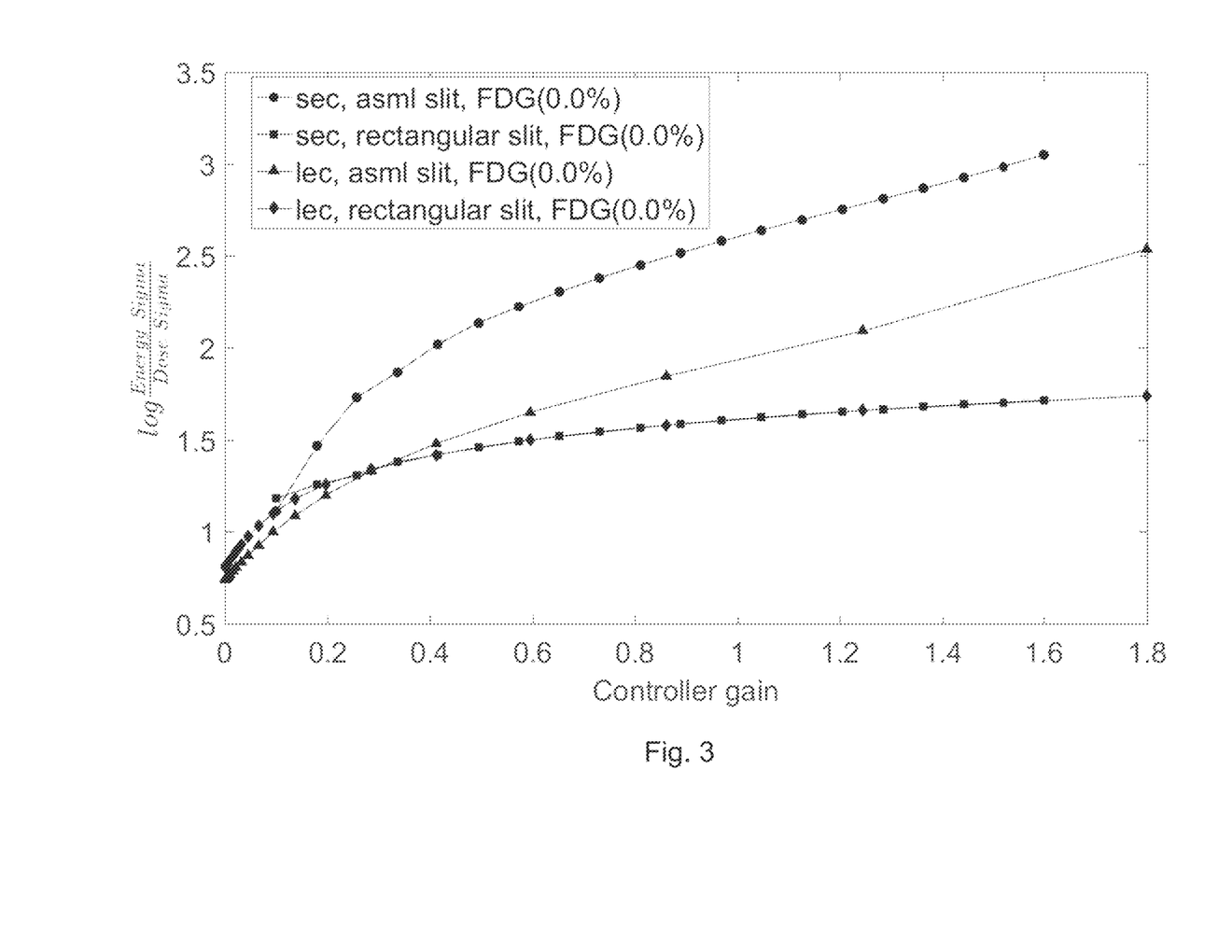
FIG. 3 illustrates graphs of the logarithm of the energy sigma/dose sigma ratio versus gain in various embodiments.

FIG. 3 illustrates graphs of the logarithm of the energy sigma/dose sigma ratio versus gain for the same four controller and slit combinations as shown in FIG. 2. It will be apparent that for all four combinations the relationship between log(energy sigma/dose sigma) and gain is also monotonic.

Figure 4:
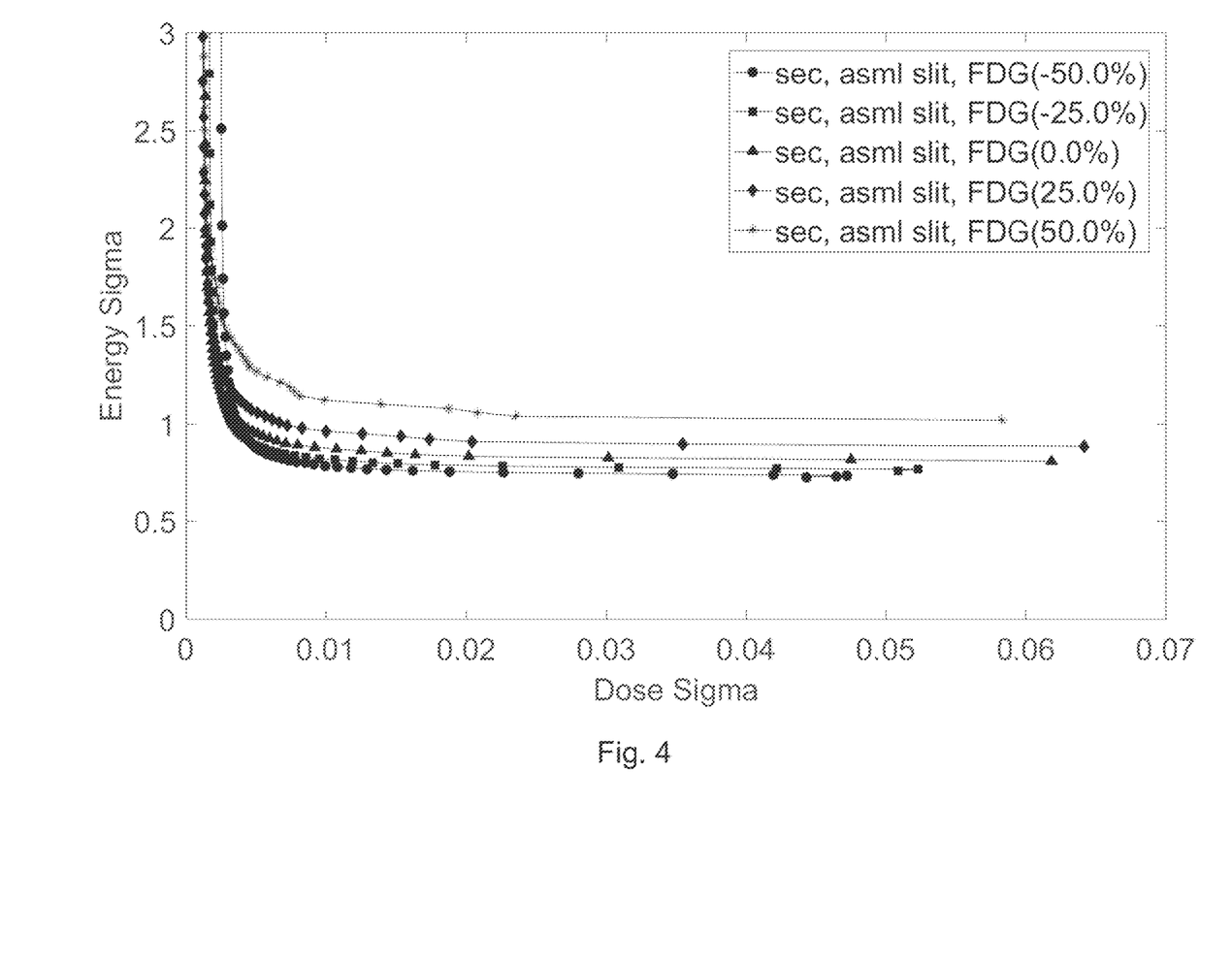
FIG. 4 illustrates graphs of energy sigma versus dose sigma for an SEC with the ASML slit for different conditions of frequency dependent gain in one embodiment.

FIG. 4 illustrates graphs of energy sigma versus dose sigma for an SEC with the ASML slit for five different conditions of FDG. The ±25% and ±50% conditions refer to variations in gain of 25% and 50%, respectively, from the desired system gain. (An FDG of 25% means that the high frequency gain is 25% more than the low frequency gain. The prior art will choose either a low or high frequency gain and will optimize the gain for that frequency. This puts the system is at risk if the net gain at the other frequency is too different.) One of skill in the art will appreciate that, as may be seen in FIG. 4, improvement (i.e., a decrease in value) in either energy sigma or dose sigma results in deterioration (i.e., an increase in value) in the other. The general goal is thus try to get both to be as low as possible without greatly increasing the other, which means that the best operating conditions will be found in the lower left hand corner of each particular graph.

Figure 5:
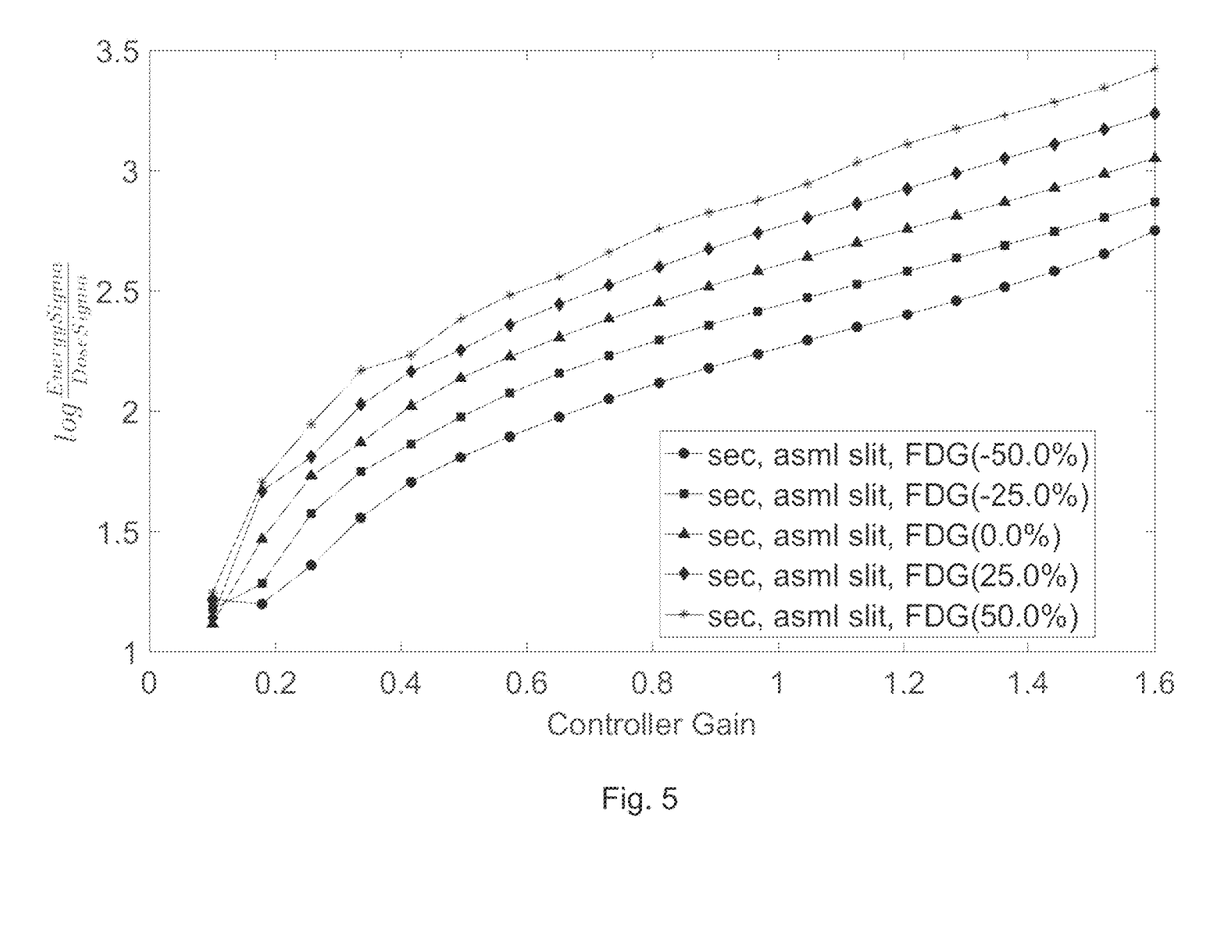
FIG. 5 illustrates graphs of the logarithm of the energy sigma/dose sigma ratio versus gain for a scanner energy controller for different conditions of frequency dependent gain in one embodiment.

FIG. 5 illustrates graphs of the logarithm of the energy sigma/dose sigma ratio versus gain for an SEC with the ASML slit for five different conditions of FDG. Note that the center curve of FIG. 5, marked with triangles and for which the FDG is stated to be 0, is the same as the curve for an SEC with an ASML slit in FIG. 3. It will be seen that the value of the energy sigma/dose sigma ratio (and thus its logarithm) for a given gain changes with the change in FDG, and that a given energy sigma/dose sigma ratio corresponds to different controller gain settings, i.e., different combinations of gain and FDG. The use of the energy sigma/dose sigma ratio thus allows the controller to adjust the gain as appropriate for any given level of FDG, unlike the prior art solution. While the illustrated graphs are for an SEC, it is expected that the same results would be obtained for any of the other graphs of FIG. 3, and thus for an LEC and/or a rectangular slit.

Figure 6:
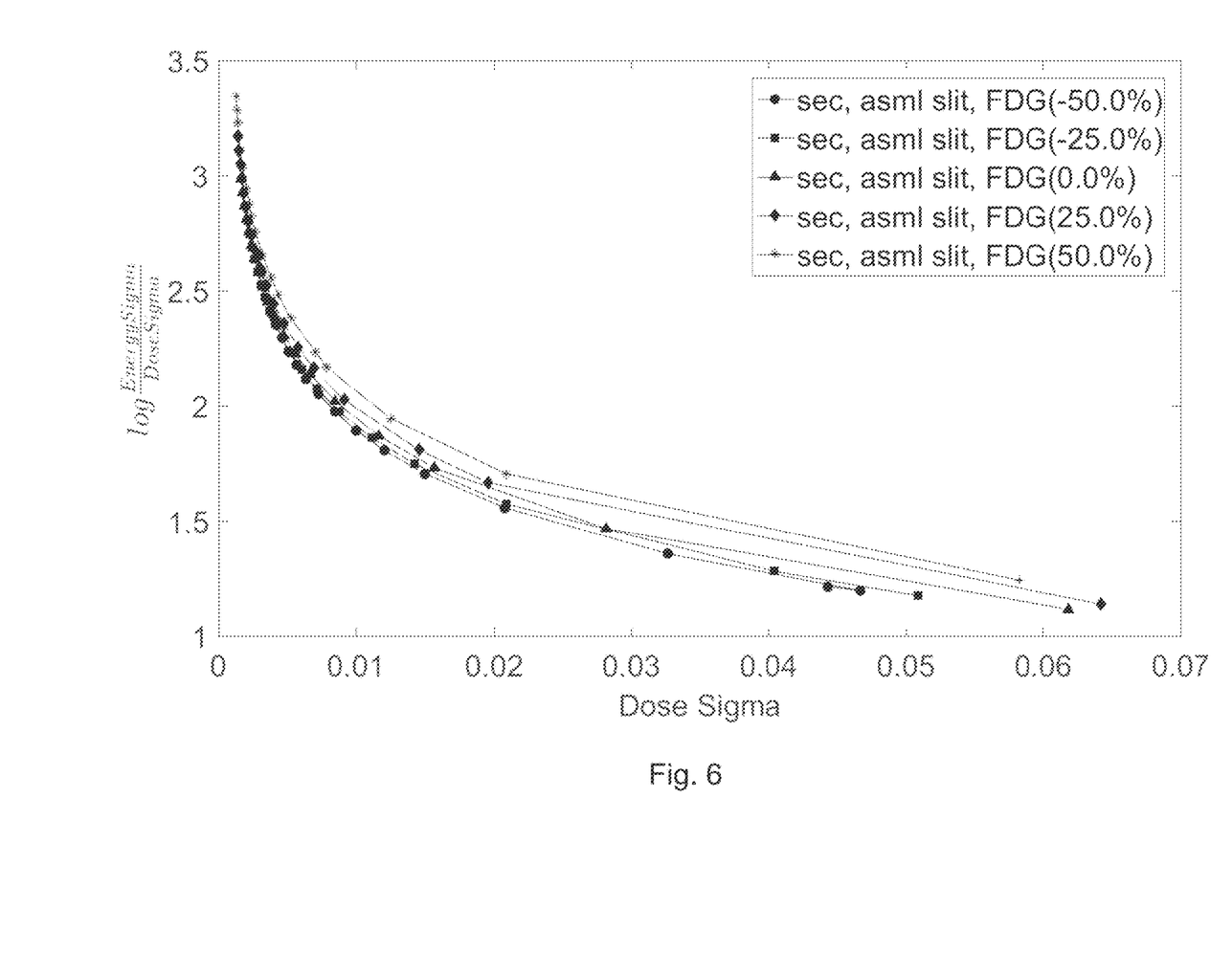
FIG. 6 illustrates graphs of the logarithm of the energy sigma/dose sigma ratio versus dose for a scanner energy controller for different conditions of frequency dependent gain in one embodiment.
Figure 7:
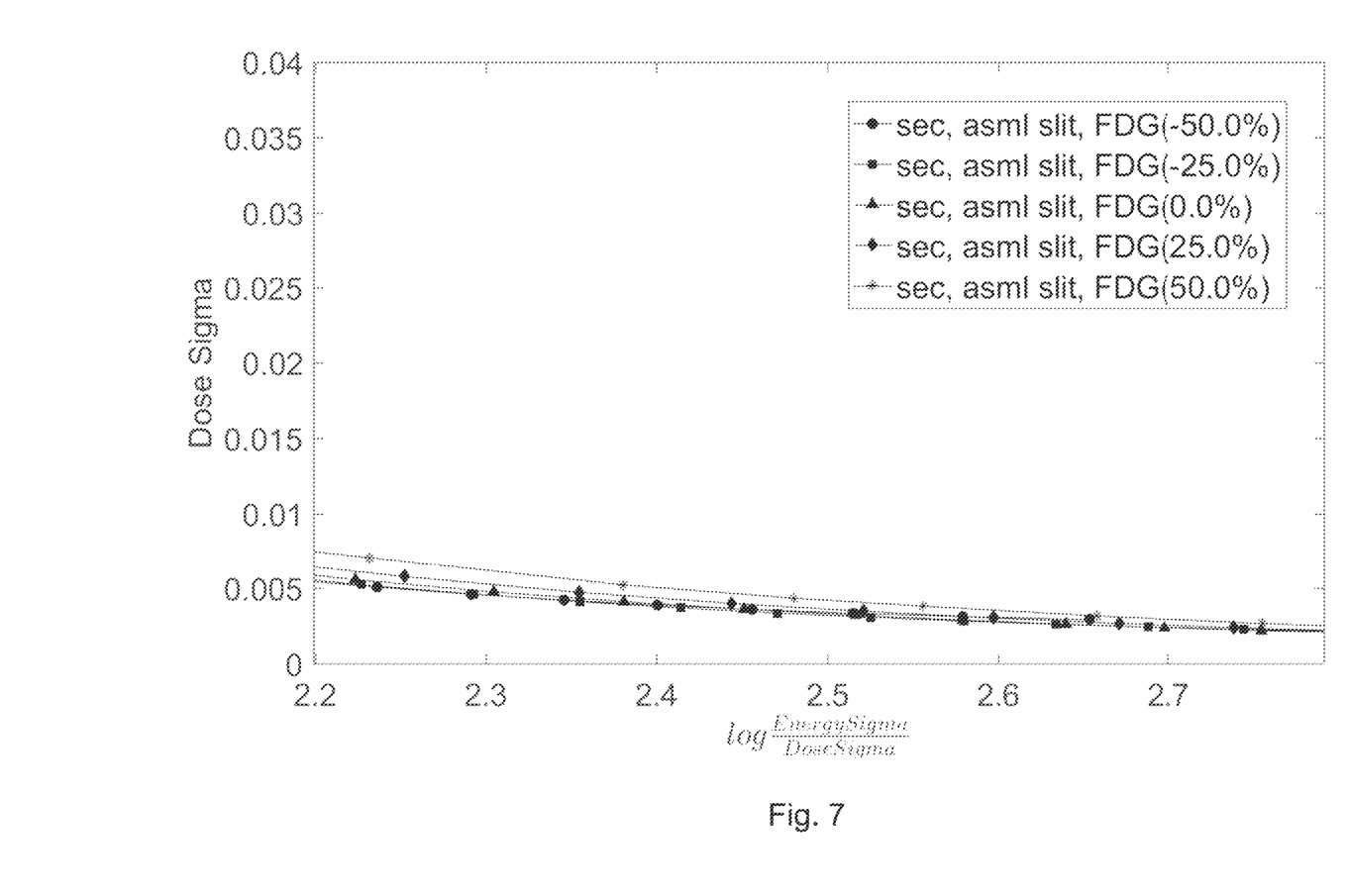
FIG. 7 is an enlarged view of a portion of the graphs of FIG. 5 with axes swapped.

FIG. 6 illustrates graphs of the logarithm of the energy sigma/dose sigma ratio versus dose (rather than gain as in FIG. 5), again for an SEC with the ASML slit and for five different conditions of FDG. FIG. 7 is an enlarged view of a portion of the graphs of FIG. 6, corresponding to an expected region of operation, with the axes swapped. It will be seen that dose sigma does not vary very much with the logarithm of the energy sigma/dose sigma ratio. One of skill in the art will appreciate that it will be desirable to operate in a position where the controller gain matches the inverse of the laser gain, so that there are small gains to the actual dose when the sigma/dose ratio is varying due to uncertainties in the system operation. For an SEC with the ASML slit, for example, it will be desirable to operate where the logarithm of the energy sigma/dose sigma ratio is in the range of 2 to 3. One of skill in the art will also appreciate that again similar results will be obtained for the other configurations of LEC and/or rectangular slit.

Experience shows that energy sigma versus dose sigma is a strong function of FDG for a given controller. One of skill in the art will be able to confirm that energy sigma versus dose sigma is quite dependent on noise, while the energy sigma/dose sigma ratio is largely independent of the noise level, although this is not apparent in the Figures.

Figure 8:
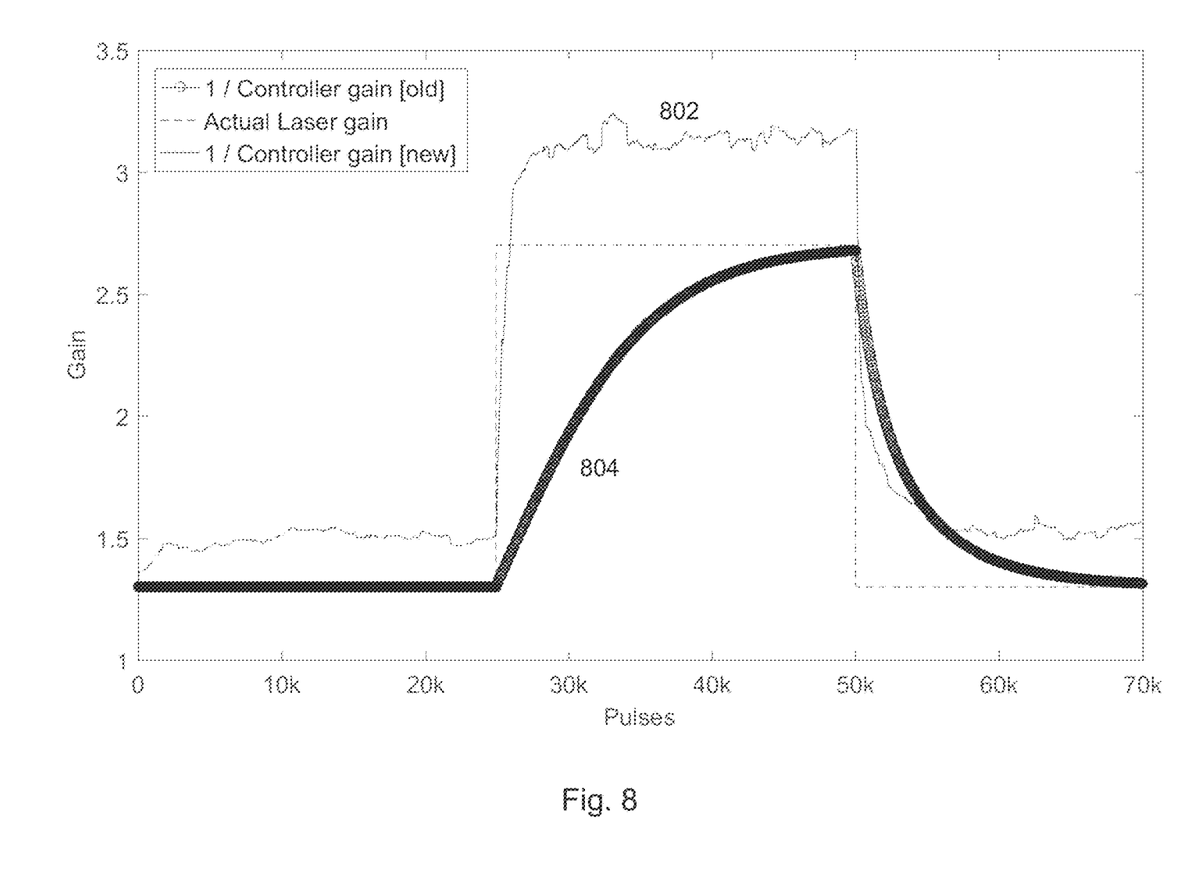
FIG. 8 illustrates graphs of the inverse of the controller gain over a number of pulses in the presence of a single step in system gain using both the current method and the traditional method.
Figure 9:
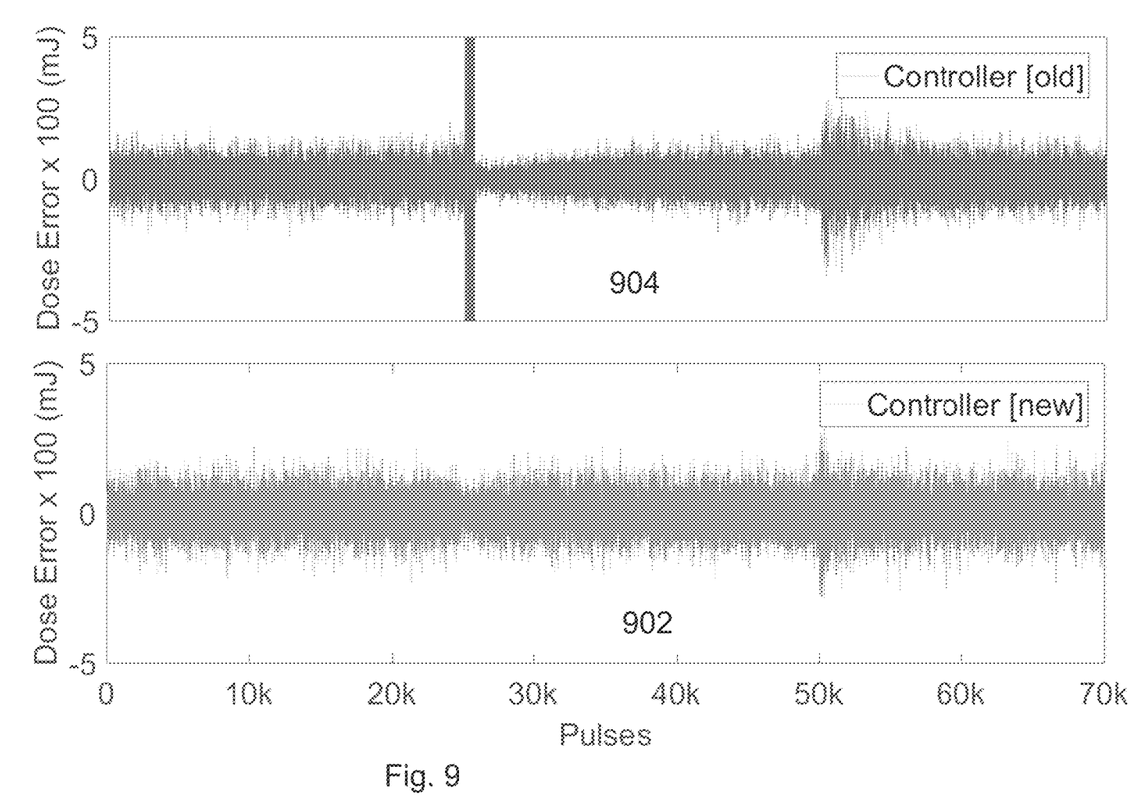
FIG. 9 illustrates graphs of the dose errors in the presence of a large variation in system gain using both the current method and the traditional method.

FIGS. 8 and 9 illustrate the performance of a system using the described sigma/dose ratio in the presence of large FDG variation. In a prior art system, one might know the system gain only at one frequency (a high one), while the gain at low frequency varies. Using traditional dv/de, if the FDG at high frequency is 50%, then the gain will increase to 2.0 at the low frequency from the 1.0 gain at high frequency.

FIG. 8 illustrates graphs of the inverse of the controller gain over a number of pulses in the presence of a single step in system gain using both the current method and the traditional method. Curve 802 is a graph of the inverse of gain when the current method is used, while curve 804 is a graph of the inverse of gain under the traditional method. It may be seen that the current method follows a step in gain much more quickly than the traditional method, which is only able to respond in a long curve over thousands of laser pulses.

FIG. 9 illustrates graphs of the dose error in the presence of a large variation in system gain using both the new method and the traditional, or "old", method. Curve 902 is a graph of the dose error when the new method is used, while curve 904 is a graph of the dose error under the traditional method. It will be seen that the dose error of the two methods is comparable when the system is in a steady state and then, at about 25,000 pulses and 75,000 pulses, system gain changes and the traditional method shows large dose variations before recovering. On the other hand, the new method stays closer to nominal dose levels faster recovery across system gain changes.

Figure 10:
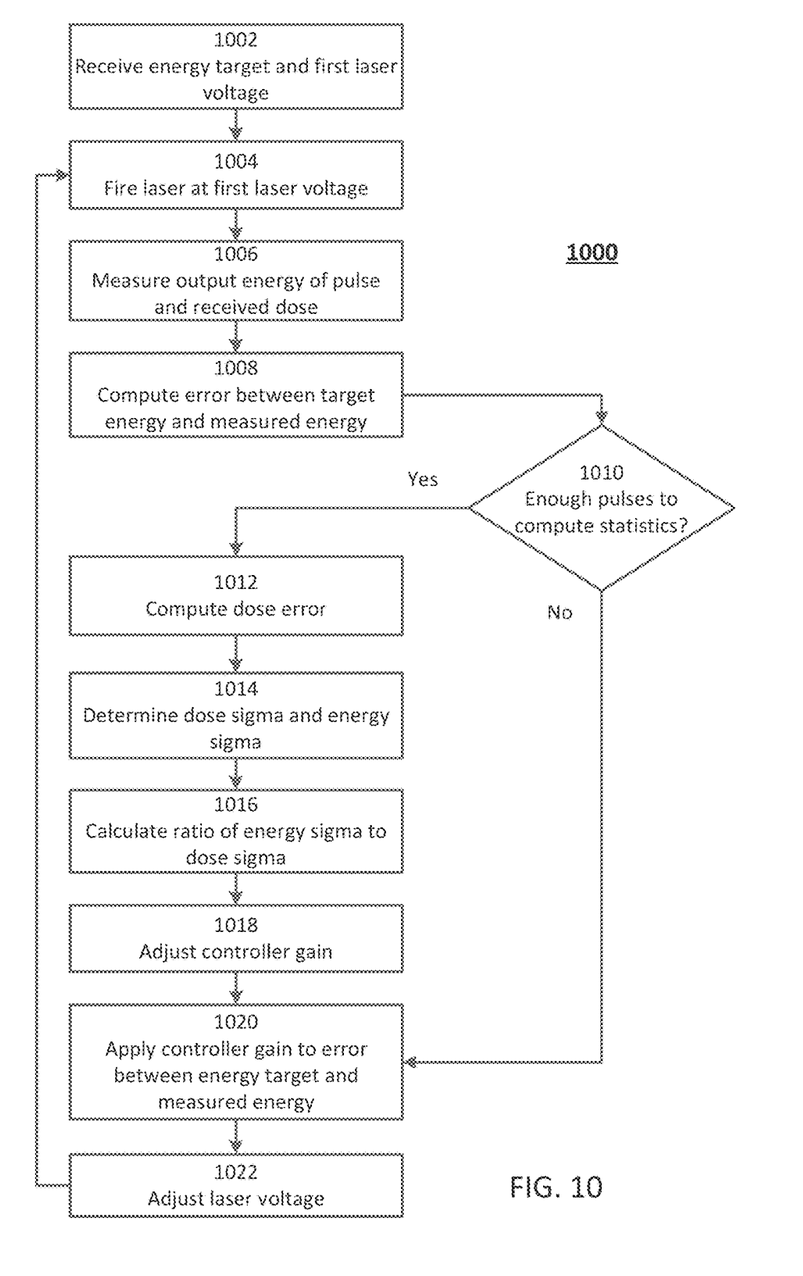
FIG. 10 is a flowchart of one embodiment of the described method.

FIG. 10 is a flowchart of one embodiment of a method 1000 according to one embodiment of the present approach.

At step 1002, a dose controller receives an energy target and a first laser voltage. The first laser voltage is chosen to cause the laser source to produce an output energy that is expected to result in a dose at the scanner that is close to the dose target. The first laser voltage is typically chosen through a calibration process overseen by the scanner.

At step 1004, the dose controller causes the laser source to fire a laser pulse using the first laser voltage. As the pulses is fired, at step 1006 a sensor, such as sensor 145 in FIG. 1, measures the output energy generated by the laser source for the pulse, and. In other embodiments, a second sensor, such as sensor 150 in FIG. 1, measures the energy from the pulse and/or the dose received at scanner 140 from the pulse. In some embodiments, these measurements are made after each pulse, while in other embodiments the measurements are made after some number of pulses or at any desired sampling intervals. At step 1008 the error between the target energy and the measured energy, and between the desired dose and the measured dose, are computed. The dose controller also counts the number of laser pulses that have been fired.

Next, at step 1010, the dose controller determines whether enough pulses have been fired to determine the desired statistics. As above, the number of pulses should be large enough to allow the described values to be calculated. The number may be pre-selected based upon experience, or the dose controller may contain instructions that allow it to determine if enough laser pulses have occurred. If not enough laser pulses have been fired to do so, the method goes to step 1020, and the existing controller gain is applied to the error between the energy target and the measured energy.

If enough laser pulse have been fired, at step 1012 the dose controller computes a dose error from the measured energy error, or, in some embodiments, the dose error is measured directly, and then, at step 1014, determines the dose sigma and energy sigma, representing the variation in dose energy and output energy, respectively, over a number of pulses as described above. Such measurements and determination are within normal skill in the art.

At step 1016, using the determined values of dose sigma and energy sigma, the dose controller calculates the ratio of energy sigma to dose sigma. Using the ratio of energy sigma and dose sigma, at step 1018 the dose controller adjusts the controller gain.

At step 1020, the dose controller updates the controller gain, using either the controller gain as adjusted in step 1018 if there have been enough laser pulses to determine the energy sigma to dose sigma ratio, or the controller gain based upon the difference between target energy and measured energy if there have not been enough laser pulses.

At step 1022, the dose controller then determines an updated laser voltage based on the newly scaled error and prior voltages. The method then returns to step 1004, and the dose controller causes the laser source to fire using the updated laser voltage.

It will be appreciated that, as described above, some number of pulses will be fired at each voltage to give the dose controller sufficient time to determine the averages needed to calculate energy sigma and dose sigma, and thus the energy sigma to dose sigma ratio. As also described above, this number of pulses is well below the number of pulses, typically in the thousands, needed to calculate the dv/de ratio of the prior art. Once there have been a sufficient number of laser pulses, the energy sigma and dose sigma may be recalculated after each pulse, or the dose controller may wait until a completely new set of the appropriate number of pulses has occurred to recalculate energy sigma and dose sigma.

The disclosed method and apparatus have been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above.

While certain examples have been provided of various configurations, components and parameters, one of skill in the art will also be able to determine other possibilities that may be appropriate for a particular DUV system. One of skill in the art will appreciate how to compensate for different types of source lasers and other optics, or other components, or different frequencies pulses.

It is to be understood that dose controller 130 can be any computing system comprising a processor and memory, including a personal computer, server, or other processing system, that runs software instructions for performing the described operations which instructions may themselves have come from or reside on a computer readable storage medium. Alternatively, dose controller 130 can be any dedicated hardware such as an application specific integrated circuit (ASIC) or other hardwired device, with or without firmware, which is specifically configured to perform the described operations.

It should also be appreciated that the described method and apparatus can be implemented in numerous ways, including as a process, an apparatus, or a system. The methods described herein may be implemented in part by program instructions for instructing a processor to perform such methods, and such instructions stored on a non-transitory computer readable storage medium such as a hard disk drive, floppy disk, optical disc such as a compact disc (CD)

or digital versatile disc (DVD), flash memory, etc. In some embodiments the program instructions may be stored remotely and sent over a network via optical or electronic communication links. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of laser light dose control comprising:
receiving, by a dose controller, an energy target and a first laser voltage; causing, by the dose controller, a laser source to fire a plurality of laser pulses starting at the first laser voltage;
measuring, by a sensor, output energy generated by the laser source for each of the plurality of pulses;
for a number of laser pulses, after one or more pulses, adjusting, by the dose controller, the first laser voltage based upon a controller gain and a difference between the energy target and the measured output energy;
receiving, by the dose controller, a measurement of dose energy received at a scanner from the plurality of pulses;
once the number of laser pulses has been fired, determining, by the dose controller, an energy sigma representing variation in average output energy over the number of pulses;
determining, by the dose controller, a dose sigma representing variation between the dose energy received at the scanner and a dose target;
calculating, by the dose controller, a ratio of the energy sigma to the dose sigma;
updating, by the dose controller, the controller gain in response to a change in the ratio;
updating, by the dose controller, the first laser voltage based upon the controller gain and the difference between the energy target and the measured output energy;
causing, by the dose controller, the laser source to fire additional laser pulses using the updated laser voltage.

2. The method of claim 1 wherein each plurality of laser pulses is at deep ultraviolet wavelengths.

3. The method of claim 1 wherein the energy sigma represents a standard deviation of the energy received at the scanner over the number of laser pulses.

4. The method of claim 1 wherein the dose sigma is a weighted moving average dose error of the number of laser pulses.

5. A laser system for laser light dose control comprising:
a sensor for measuring output energy generated by a laser source for each of a plurality of pulses;
a dose controller configured to:
receive an energy target and a first laser voltage;
cause the laser source to fire a plurality of pulses starting at the first laser voltage;
for a number of laser pulses, after one or more pulses, adjust the first laser voltage based upon a difference between the energy target and the measured output energy;
receive from a scanner, for the plurality of pulses, a measurement of dose energy received at the scanner;
once the number of laser pulses has been fired, determine an energy sigma representing variation in average output energy over the number of pulses;
determine a dose sigma representing variation between the dose energy received at the scanner and the dose target;
calculate a ratio of the energy sigma to the dose sigma;
update the controller gain in response a change in the ratio; update the first laser voltage in response to a change in a controller gain;
cause the laser source to fire additional laser pulses using the updated first laser voltage.

6. The system of claim 5 wherein each plurality of laser pulses is at deep ultraviolet wavelengths.

7. The system of claim 5 wherein the energy sigma represents a standard deviation of the energy received at the scanner over the number of laser pulses.

8. The system of claim 5 wherein the dose sigma is a weighted moving average energy error of the number of laser pulses.

9. A non-transitory computer readable storage medium having embodied thereon instructions for causing a computing device to execute a method for laser light dose control, the method comprising:
receiving, by a dose controller, an energy target and a first laser voltage;
causing, by the dose controller, a laser source to fire a plurality of laser pulses starting at the first laser voltage;
measuring, by a sensor, output energy generated by the laser source for each of the plurality of pulses;
for a number of laser pulses, after one or more pulses, adjusting, by the dose controller, the first laser voltage based upon a difference between the energy target and the measured output energy;
receiving, by the dose controller, a measurement of dose energy received at a scanner from the plurality of pulses;
once the number of laser pulses has been fired, determining, by the dose controller, an energy sigma representing variation in average output energy over the number of pulses;
determining, by the dose controller, a dose sigma representing variation between the dose energy received at the scanner and the dose target;
calculating, by the dose controller, a ratio of the energy sigma to the dose sigma;
updating, by the dose controller, a controller gain, in response to a change in the ratio;
updating, by the dose controller, the laser voltage in response to a change in the controller gain;
causing, by the dose controller, the laser source to fire additional laser pulses using the updated laser voltage.

* * * * *